United States Patent
Yang

(10) Patent No.: US 9,793,156 B1
(45) Date of Patent: Oct. 17, 2017

(54) SELF-ALIGNED LOW RESISTANCE METALLIC INTERCONNECT STRUCTURES

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/262,231

(22) Filed: Sep. 12, 2016

(51) Int. Cl.
| | |
|---|---|
| H01L 23/528 | (2006.01) |
| H01L 21/283 | (2006.01) |
| H01L 21/306 | (2006.01) |
| H01L 21/3205 | (2006.01) |
| H01L 21/3213 | (2006.01) |
| H01L 21/768 | (2006.01) |
| H01L 29/49 | (2006.01) |
| H01L 29/66 | (2006.01) |
| H01L 29/78 | (2006.01) |
| H01L 23/522 | (2006.01) |
| H01L 23/532 | (2006.01) |

(52) U.S. Cl.
CPC .... *H01L 21/76816* (2013.01); *H01L 21/7681* (2013.01); *H01L 21/76849* (2013.01); *H01L 21/76879* (2013.01); *H01L 21/76883* (2013.01); *H01L 21/76897* (2013.01); *H01L 23/528* (2013.01); *H01L 23/5226* (2013.01); *H01L 23/53228* (2013.01)

(58) Field of Classification Search
CPC ......... H01L 21/76816; H01L 23/528
See application file for complete search history.

(56) References Cited

U.S. PATENT DOCUMENTS

| | | | |
|---|---|---|---|
| 6,180,530 B1 * | 1/2001 | Liaw | H01L 21/76897 257/E21.507 |
| 8,852,305 B2 | 10/2014 | Andersson et al. | |
| 8,864,861 B2 | 10/2014 | Andersson et al. | |
| 8,888,841 B2 | 11/2014 | Pandelidis et al. | |
| 8,893,711 B2 | 11/2014 | Kennedy | |
| 8,895,099 B2 | 11/2014 | Atanasoska et al. | |
| 8,993,472 B2 | 3/2015 | Roller et al. | |
| 9,005,769 B2 | 4/2015 | Lambert et al. | |
| 9,017,762 B2 | 4/2015 | Rozak et al. | |
| 9,023,486 B2 | 5/2015 | Nagaraj et al. | |
| 9,031,184 B2 | 5/2015 | Cabrero et al. | |

(Continued)

*Primary Examiner* — Moazzam Hossain
(74) *Attorney, Agent, or Firm* — Louis J. Percello; Ryan, Mason & Lewis, LLP

(57) ABSTRACT

Methods are provided for fabricating self-aligned, low resistance metal interconnect structures, as well as semiconductor devices comprising such metal interconnect structures. A first metal line is formed in a first insulating layer. An etch stop layer is formed by selectively depositing dielectric material on the first insulating layer. A second insulating layer is formed over the etch stop layer and the first metal line, and an opening is etched in the second insulating layer selective to the etch stop layer to prevent etching of the first insulating layer. The opening is filled with a metallic material to form a second metal line in contact with the first metal line. The first and second metal lines are formed with aspect ratios that are less than 2.5 to minimize resistivity of the metal lines. The first and second metal lines collectively form a single metal line of an interconnect structure.

20 Claims, 16 Drawing Sheets

(56) References Cited

U.S. PATENT DOCUMENTS

| | | | |
|---|---|---|---|
| 9,034,465 B2 | 5/2015 | Peters et al. | |
| 9,034,479 B2 | 5/2015 | Nagaraj et al. | |
| 2006/0071211 A1* | 4/2006 | Lee | H01L 27/12 |
| | | | 257/59 |
| 2006/0264033 A1* | 11/2006 | Olmen | H01L 21/76808 |
| | | | 438/637 |
| 2007/0037394 A1* | 2/2007 | Su | H01L 21/76808 |
| | | | 438/687 |
| 2007/0197012 A1* | 8/2007 | Yang | H01L 21/76805 |
| | | | 438/597 |
| 2007/0238213 A1* | 10/2007 | Yamaguchi | B81C 1/00682 |
| | | | 438/48 |
| 2012/0060908 A1* | 3/2012 | Crafts | H01L 31/022425 |
| | | | 136/255 |
| 2013/0062769 A1* | 3/2013 | Cabral, Jr. | H01L 23/53238 |
| | | | 257/751 |
| 2014/0120722 A1* | 5/2014 | Richardson | C25D 3/38 |
| | | | 438/675 |
| 2014/0264880 A1* | 9/2014 | Sung | H01L 23/53295 |
| | | | 257/758 |
| 2014/0301861 A1 | 10/2014 | Bruce et al. | |
| 2014/0324156 A1 | 10/2014 | Yin et al. | |
| 2015/0129087 A1 | 5/2015 | Hintz | |
| 2015/0132926 A1 | 5/2015 | D'Evelyn et al. | |
| 2016/0343660 A1* | 11/2016 | Kim | H01L 23/535 |

\* cited by examiner

US 9,793,156 B1

SELF-ALIGNED LOW RESISTANCE METALLIC INTERCONNECT STRUCTURES

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper material is known to significantly reduce resistance in the BEOL interconnect structure, resulting in improved conduction and higher performance. As copper interconnect structures are scaled down, however, resistivity of the copper interconnect structures increases exponentially, which is undesirable.

SUMMARY

Embodiments of the invention include methods for fabricating self-aligned, low resistance metal interconnect structures for integrated circuits, as well as semiconductor devices comprising self-aligned, low resistance metal interconnect structures. For example, one embodiment includes a method of forming a semiconductor device, which comprises: forming a first insulating layer on a substrate; forming a first metal line in the first insulating layer, wherein the first metal line comprises a first aspect ratio which is less than 2.5; forming an etch stop layer on a surface of the first insulating layer, wherein forming the etch stop layer comprises selectively depositing a layer of dielectric material on the surface of the first insulating layer selective to the first metal line; depositing a second insulating layer over the etch stop layer and the first metal line; etching the second insulating layer to form an opening in the second insulating layer down to the first metal line, wherein the second insulating layer is etched selective to the etch stop layer to prevent etching of the first insulating layer; and filling the opening with a metallic material to form a second metal line in contact with the first metal line, wherein the second metal line comprises a second aspect ratio which is less than 2.5.

In another embodiment, the second metal line is formed by depositing a layer of metallic material over the second insulating layer to fill the opening in the second insulating layer with the metallic material, performing a heat treatment to convert a microstructure of the deposited metallic material from a first microstructure to a second microstructure, and removing overburden metallic material from the surface of the second insulating layer. For example, the first microstructure comprises a polycrystalline microstructure and the second microstructure comprises a bamboo microstructure.

Another embodiment of the invention includes a semiconductor device which comprises: a first insulating layer formed on a substrate; a first metal line formed in the first insulating layer, wherein the first metal line comprises a first aspect ratio which is less than 2.5; an etch stop layer selectively formed on a surface of the first insulating layer; a second insulating layer formed over the etch stop layer and the first metal line; and a second metal line formed in the second insulating layer in contact with the first metal line, wherein the second metal line comprises a second aspect ratio which is less than 2.5. In one embodiment, the first metal line comprises a bamboo microstructure and the second metal line comprises a bamboo microstructure, wherein an average grain size of the first and second metal lines is greater than a critical dimension of the first and second metal lines. In another embodiment, the first metal line and the second metal line comprise a same pattern, wherein the first metal line and the second metal line collectively form a single copper damascene interconnect structure.

Other embodiments will be described in the following detailed description of embodiments, which is to be read in conjunction with the accompanying figures.

BRIEF DESCRIPTION OF THE DRAWINGS

FIGS. 4 through 13 schematically illustrate a method for fabricating the semiconductor device of FIG. 1, according to an embodiment of the invention, wherein:

FIG. 4 schematically illustrates the semiconductor device at an intermediate stage of fabrication after depositing a first interlevel dielectric (ILD) layer on a substrate and etching an opening in the first ILD layer;

FIG. 5 is cross-sectional schematic side view of the semiconductor structure of FIG. 4 after depositing a layer of liner material to line the sidewall and bottom surfaces of the opening in the first ILD layer with liner material;

FIG. 6 is cross-sectional schematic side view of the semiconductor structure of FIG. 5 after depositing a first layer of metallic material to fill the opening in the first ILD layer with metallic material, wherein the first layer of metallic material as deposited comprises a polycrystalline microstructure;

FIG. 7 is cross-sectional schematic side view of the semiconductor structure of FIG. 6 after applying a heat treatment to convert the polycrystalline microstructure of at least a portion of the first layer of metallic material to a columnar or bamboo microstructure;

FIG. 8 is cross-sectional schematic side view of the semiconductor structure of FIG. 7 after planarizing the surface of the semiconductor structure down to the first ILD layer to form a first metal interconnect structure in the first ILD layer;

FIG. 9 is cross-sectional schematic side view of the semiconductor structure of FIG. 8 after selectively depositing dielectric material on the first ILD layer to form an etch stop layer;

FIG. 11 is cross-sectional schematic side view of the semiconductor structure of FIG. 10A after depositing a layer of liner material to line the sidewall and bottom surfaces of the opening in the second ILD layer with liner material;

FIG. 12 is cross-sectional schematic side view of the semiconductor structure of FIG. 11 after depositing a second layer of metallic material to fill the opening in the second ILD layer with metallic material, wherein the second layer of metallic material as deposited comprises a polycrystalline microstructure; and FIG. 13 is cross-sectional schematic side view of the semiconductor structure of FIG. 12 after applying a heat treatment to convert the polycrystalline microstructure of the second layer of metallic material to a columnar or bamboo microstructure.

DETAILED DESCRIPTION

Embodiments will now be described in further detail with regard to methods for fabricating self-aligned, low resistance metal interconnect structures for integrated circuits, as well as semiconductor devices comprising BEOL interconnect structures that are formed with self-aligned, low resistance metal interconnect structures. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
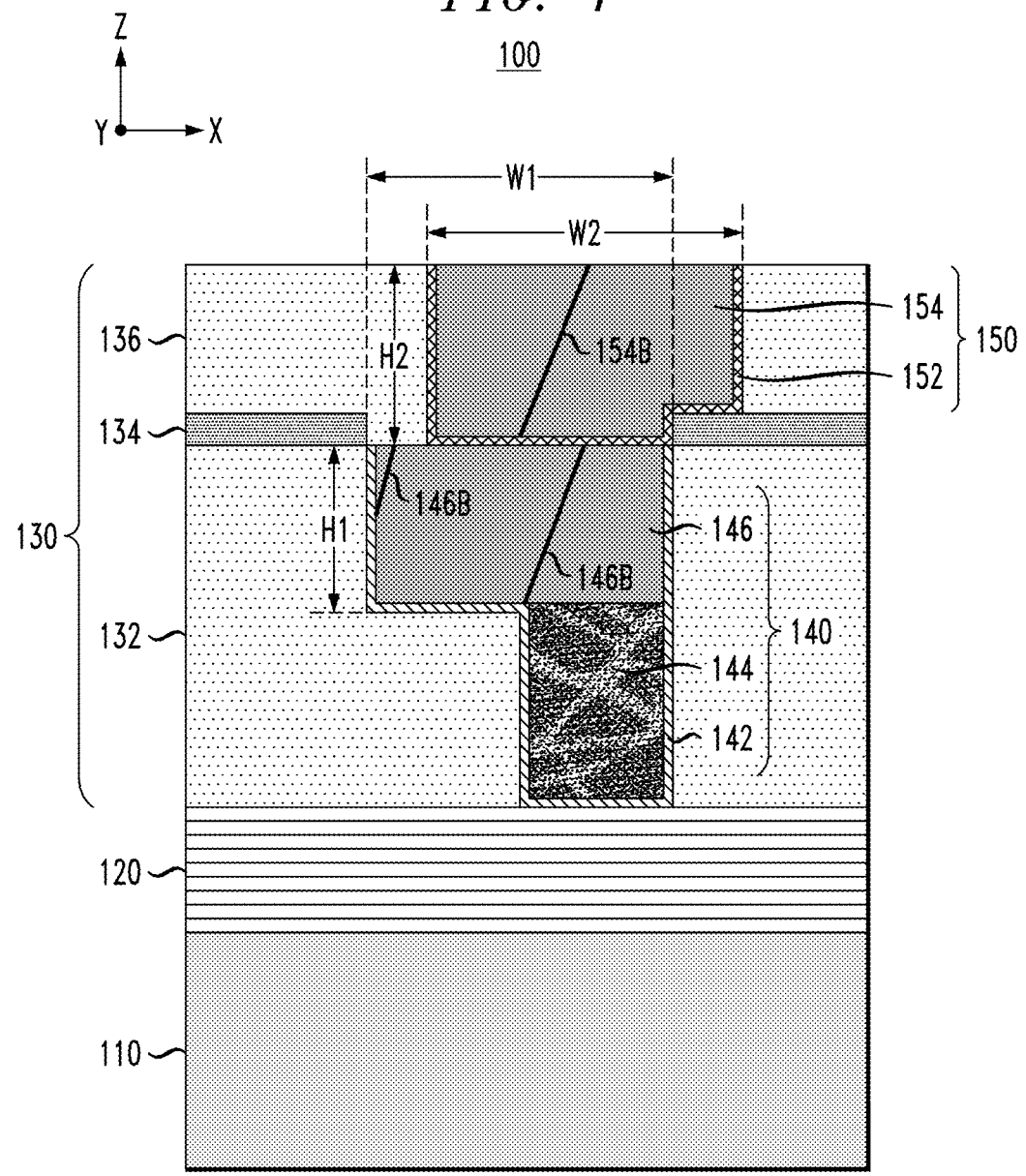
FIG. 1 is cross-sectional schematic view of a semiconductor device comprising a BEOL structure that is formed with self-aligned, low resistance metal interconnect structures, according to an embodiment of the invention.

FIG. 1 is cross-sectional schematic view of a semiconductor device 100 comprising a BEOL structure that is formed with self-aligned, low resistance metal interconnect structures, according to an embodiment of the invention. More specifically, FIG. 1 is a schematic side view of the semiconductor device 100 in a X-Z plane, as indicated by the XYZ Cartesian coordinates shown in FIG. 1. It is to be understood that the term "vertical" or "vertical direction" as used herein denotes a Z-direction of the Cartesian coordinates shown in the drawings, and the term "horizontal" or "horizontal direction" as used herein denotes an X-direction and/or Y-direction of the Cartesian coordinates shown in the drawings. The semiconductor device 100 comprises a substrate 110, a FEOL (front end of the line) and MOL (middle of the line) structure 120 (FEOL/MOL structure 120) formed on front side surface of the substrate 110, and a BEOL interconnect structure 130 formed on the FEOL/MOL structure 120. The BEOL interconnect structure 130 comprises a first interlayer dielectric (ILD) layer 132, and a first metal interconnect structure 140 embedded in the first ILD layer 132.

The first metal interconnect structure 140 comprises a liner layer 142, and a metal structure 144/146 comprising a metal via 144 and a first metal line 146. The liner layer 142 lines inner surfaces of an opening (e.g., dual damascene opening) that is patterned in the first ILD layer 132. The liner layer 142 serves as barrier diffusion layer to prevent migration of the metallic material (e.g., Cu) of the metal via 144 and the first metal line 146 into the dielectric material of the first ILD layer 132, as well as an adhesion layer to provide good adhesion to the metallic material (e.g., Cu) that is used to form the metal via 144 and the first metal line 146. The first metal line 146 comprises an aspect ratio, AR=H1/W1.

As shown in FIG. 1, the BEOL structure 130 further comprises an etch stop layer 134 formed on a surface of the first ILD layer 132, a second ILD layer 136, and a second metal interconnect structure 150 embedded in the second ILD layer 136. The second metal interconnect structure 150 comprises a liner layer 152, and a second metal line 154. The liner layer 152 lines inner surfaces of an opening (e.g., damascene opening) that is patterned in the second ILD layer 136, and serves as a barrier diffusion and adhesion layer. The second metal line 154 comprises an aspect ratio, AR=H2/W2.

In accordance with embodiments of the invention, the low resistance metal interconnects are achieved formed by forming low aspect ratio metal lines (AR<2.5) and stacking two or more of the low aspect ratio metal lines to collectively provide one metal line with a higher conducting area. Conventional interconnect structures are typically formed with metal lines having an aspect ratio of 2.8 or greater. The resistivity of metal lines (e.g., copper lines) is known to depend on factors such as the aspect ratio of the metal lines and a cross-sectional area of the metal line (which is perpendicular to the direction of conducting current). For example, for metal lines with aspect ratios of 2.8 and higher, the resistivity $\rho(\mu\Omega\text{-cm})$ of the metal material exponentially increases as the conducting cross-sectional area (cm$^2$) decreases, which is undesirable.

In accordance with embodiments of the invention, low resistivity metal lines are fabricated by forming metal lines with aspect ratios of less than 2.5. For example, in the example embodiment of FIG. 1 the first metal line 146 has an aspect ratio AR=H1/W1<2.50, and the second metal line 154 has an aspect ratio AR=H2/W2<2.50. For a given feature width W (which is fixed by the critical dimension of the particular fabrication process that is implemented), the resistivity of the first and second metal lines 146 and 154 is reduced by reducing the height (H) of the first and second metal lines 146 and 154. In other words, in accordance with embodiments of the invention, low aspect ratio metal lines (AR<2.5) are utilized to reduce the resistivity of the metal lines for a given fixed feature width W.

In one example embodiment, the width W1 of the first metal line 146 is in a range of about 5 nm to about 100 nm, and more preferably, in a range of about 10 nm to about 50 nm. Similarly, the width W2 of the second metal line 154 is in a range of about 5 nm to about 100 nm, and more preferably, in a range of about 10 nm to about 50 nm. Given the critical dimensions W1 and W2, the heights H1 and H2 of the first and second metal lines 146 and 154 are selected so that the first metal line 146 has an aspect ratio AR=H1/W1<2.50, and the second metal line 154 has an aspect ratio AR=H2/W2<2.50. Furthermore, in one example embodiment, by forming the first and second metal lines 146 and 154 to have aspect ratios of less than 2.5, the resistivity $\rho$ of the first and second metal lines 146 and 154 is less than about 7 $\mu\Omega$-cm.

While low aspect ratio metal lines can be realized by reducing the height H of the metal lines for a given width W, the reduction in the height H of a metal line also results in a decrease of the cross-sectional area A=(H)×(W) of the metal line, where the cross-sectional area A is perpendicular to the current flow along the length of the metal line (e.g., in a Y-direction in FIG. 1). A decrease in the cross-sectional area A of a metal line effectively results in an increase in the resistance of the metal line.

In this regard, in accordance with embodiments of the invention, to provide low resistance metal lines, a metal line is fabricated to comprise a stack of two or more low aspect ratio metal lines which are formed in vertically adjacent ILD layers in contact with each other. The stacked metal lines collectively provide a single metal line with a lager effective cross-sectional area, which results in a decrease in the resistance of the metal line. For example, in the example embodiment of FIG. 1, the stacked first and second metal lines 146 and 154 collectively form a single metal line 146/154, wherein the metal line 146/154 is connected to the MOL/FEOL layer 120 by the metal via 144. In the example embodiment of FIG. 1, the first and second interconnect structures 140 and 150 (formed in the separate ILD layers 132 and 136) effectively emulate a dual damascene interconnect structure comprising a metal via 144 and a metal line 146/154, which is formed as part of a first level of metallization of the BEOL structure 130. The metal line 146/154 can route electrical signals (or DC power) between different locations on the semiconductor device, and the metal via 144 connects the overlying metal line 146/154 to an underlying metal line of a lower BEOL interconnect level or to a contact of the underlying MOL layer of the FEOL/MOL structure 120.

Although not shown in FIG. 1, a third metal line can be formed in a third ILD layer on top of the second ILD layer 136, wherein the third metal line is formed in vertical alignment with, and makes contact to, the second metal line 154, to collectively form a metal line comprising three separate metal lines in a stacked configuration. Alternatively, a metal via of a third interconnect structure may be formed in a third ILD layer (over the second ILD layer 136) in contact with the upper surface of the second metal line 154, wherein the metal via provides a vertical connection from the first metallization level 140/150 to the next metallization level.

Accordingly, embodiments of the invention as described herein provide low resistance metal interconnects for BEOL structures by forming low aspect ratio metal lines (AR<2.5) to reduce the resistivity of the metallic material of the metal lines, while forming a metal line comprising a vertical stack of two or more low aspect ratio (low resistivity) metal lines to effectively increase the conducting area of metal line and thus, reduce the resistance of the metal line stack structure. As shown in FIG. 1, assuming that W1=W2=W, the metal line 146/154 formed by the vertically stacked configuration of the two separate low aspect ratio metal lines 146 and 154 provides an effective cross-sectional area of (W)×(H1+H2).

When forming vertically stacked metal lines as shown in FIG. 1, there could be misalignment between two vertically adjacent metal lines due to, e.g., patterning tolerances of the photolithography process that is used to pattern the ILD layers. For example, FIG. 1 illustrates an example embodiment where there exists a slight misalignment between the first metal line 146 and the second metal line 154 (in the X-direction). Embodiments of the invention implement methods to enable self-alignment of the vertically stacked metal lines.

For example, in one embodiment of the invention, line-to-line self-alignment is achieved by utilizing the etch stop layer 134 as shown in FIG. 1. As explained in further detail below, the etch stop layer 134 is formed (prior to forming the second ILD layer 136) by depositing a dielectric material on the surface of the first ILD layer 132 selective to the surface of the first metal line 146, so that the dielectric material is not deposited on the surface of the first metal line 146. The selective deposition of the dielectric material results in the formation of the etch stop layer 134 which fully covers the surface of the first ILD layer 132, but which exposes the surface of the first metal line 146. The etch stop layer 134 prevents etching of the first ILD layer 132 when etching an opening in the second ILD layer 136, which is subsequently filled with metallic material to form the second metal line 154. In this manner, when there is some misalignment between the vertically stacked metal lines 146 and 154 as shown in FIG. 1, the etch stop layer 134 prevents the etching of the first ILD layer 132 (when etching an opening in the second ILD layer 136), as well as prevents metallic material of the second metal line 154 from contacting the material of the first ILD layer 132.

As further shown in FIG. 1, the slight misalignment of the vertically stacked metal lines 146 and 154 can result in the material of the second ILD layer 136 making contact to a portion of the metallic material at the surface perimeter of the first metal line 146. This contact is undesirable, as the metallic material of the first metal line 146 can diffuse (via electromigration) into the dielectric material of the second ILD layer 136, causing defects and reduced performance. To address this issue, embodiments of the invention as schematically illustrated in FIGS. 2 and 3 utilize a capping layer to insulate the first metal line 146 from the second ILD layer 136 in instances where there is misalignment between the first and second metal lines 146 and 154, as shown in FIG. 1.

Figure 2:
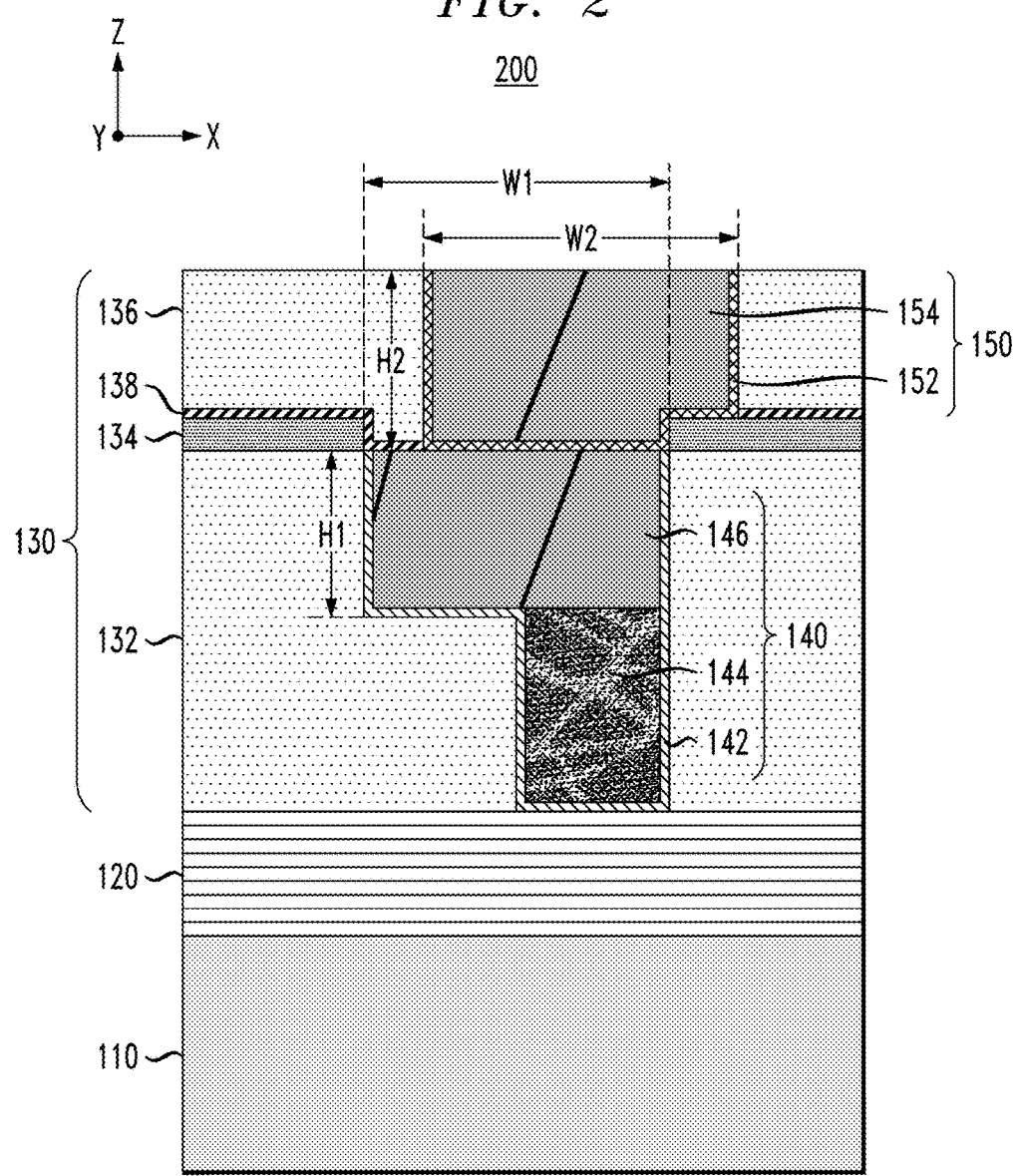
FIG. 2 is cross-sectional schematic view of a semiconductor device comprising a BEOL structure that is formed with self-aligned, low resistance metallic interconnect structures, according to another embodiment of the invention.

For example, FIG. 2 is cross-sectional schematic view of a semiconductor device 200 comprising a BEOL structure that is formed with self-aligned, low resistance metallic interconnect structures, according to another embodiment of the invention. The semiconductor device 200 of FIG. 2 is similar to the semiconductor device 100 of FIG. 1, except that the semiconductor device 200 comprises a capping layer 138 that is formed on the etch stop layer 134 and an upper surface of the first metal line 146 prior to forming the second ILD layer 136. While the portion of the capping layer 138 is removed during an etch process that is performed to etch an opening in the second ILD layer 136, a portion of the capping layer 138 remains on a portion of the surface of the first metal line 146 to insulate the first metal line 146 from the second ILD layer 136 in circumstances such as shown in FIG. 2 wherein there is a misalignment between the vertically stacked metal lines 146 and 154.

Figure 3:
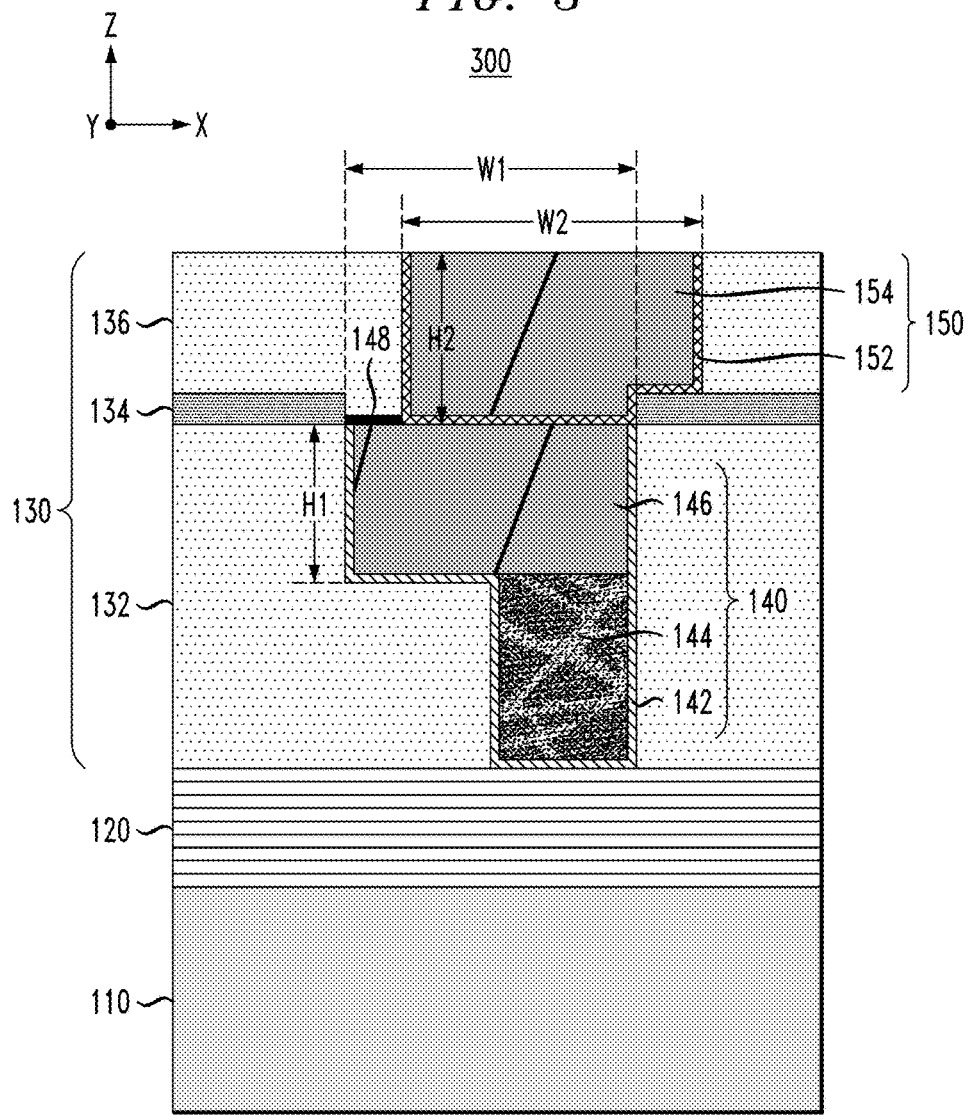
FIG. 3 is cross-sectional schematic view of a semiconductor device comprising a BEOL structure that is formed with low resistance, self-aligned metallic interconnect structures, according to yet another embodiment of the invention.

By way of further example, FIG. 3 is cross-sectional schematic view of a semiconductor device 300 comprising a BEOL structure that is formed with low resistance, self-aligned metallic interconnect structures, according to yet another embodiment of the invention. The semiconductor device 300 of FIG. 3 is similar to the semiconductor device 100 of FIG. 1, except that the semiconductor device 300 comprises a metallic capping layer 148 that is selectively formed on the upper surface of the first metal line 146 prior to forming the second ILD layer 136. While a portion of the metallic capping layer 138 is removed during an etch process that is performed to etch an opening in the second ILD layer 136 down to the surface of the first metal line 146, a portion of the metallic capping layer 148 remains on a portion of the surface of the first metal line 146 to insulate the first metal line 146 from the second ILD layer 136 in circumstances such as shown in FIG. 3 wherein there is a misalignment between the vertically stacked metal lines 146 and 154. The metallic capping layer 148 is formed of a metallic material that is non-reactive with the material of the second ILD layer 136.

Figure 4:
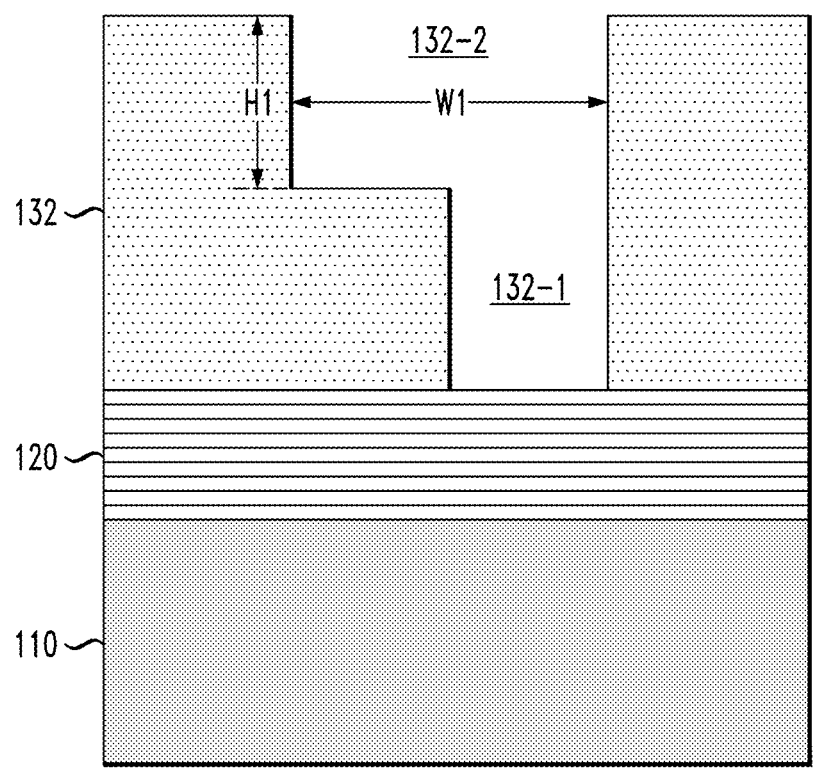

Various alternative methods for fabricating the semiconductor devices 100, 200, and 300 shown in FIGS. 1, 2 and 3, respectively, will now be discussed in further detail with reference to FIGS. 2 through 15. For example, FIGS. 4 through 13 schematically illustrate different stages of a process flow for fabricating the semiconductor device 100 of FIG. 1, according to an embodiment of the invention. To begin, FIG. 4 schematically illustrates the semiconductor device at an intermediate stage of fabrication after depositing the first ILD layer 132 on the substrate 110/120, and etching an opening 132-1/132-2 in the first ILD layer 132. In particular, FIG. 4 illustrates an intermediate structure in which the FEOL/MOL structure 120 is formed on the semiconductor substrate 110, with the first ILD layer 132 deposited on the FEOL/MOL structure 120 and patterned to form a damascene opening comprising a via opening 132-1 and a trench 132-2. The trench 132-2 is formed with a width W1 and a height H1 above the via opening 132-1, providing an aspect ratio of H1/W1 which is less than 2.5.

The semiconductor substrate 110 is illustrated as a generic substrate layer, and may comprise different types of substrate structures. For example, in one embodiment, the semiconductor substrate 110 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL layer.

In particular, the FEOL/MOL structure 120 comprises a FEOL layer formed on the substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of the BEOL structure 130 (FIG. 1).

The BEOL interconnect structure 130 (FIG. 1) is formed on the FEOL/MOL structure 120 to connect the various integrated circuit components of the FEOL layer. As is known in the art, a BEOL structure comprises multiple levels dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the example embodiment of FIG. 4, the first ILD layer 132 is formed as part of a first interconnect layer of the BEOL interconnect structure 130 (FIG. 1). The first ILD layer 132 may comprise any suitable dielectric material that is commonly utilized in BEOL process technologies. For example, the first ILD layer 132 can be formed of a dielectric material including, but not limited to, silicon oxide (e.g. $SiO_2$), silicon nitride (e.g., $Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The first ILD layer 132 may be deposited using known deposition techniques, such as, for example, ALD (atomic layer deposition), CVD (chemical vapor deposition) PECVD (plasma-enhanced CVD), or PVD (physical vapor deposition), or spin-on deposition. The thickness of the first ILD layer 132 will vary depending on the application, and may have a thickness in a range of about 30 nm to about 200 nm, for example.

The first ILD layer 132 can be photolithographically patterned using known damascene techniques to form the opening 132-1/132-2 in the first ILD layer 132. The example embodiment of FIG. 4 illustrates one method for patterning the via opening 132-1 and the trench opening 132-2 in a single layer of dielectric material (i.e., the first ILD layer 132) using one of various "dual" damascene patterning techniques known in the art. In particular, such dual damascene techniques generally include a "via first" process, a "trench first" process, and a "buried via" process, which comprises different sequences for etching the first ILD layer 132 to pattern the via opening 132-1 and trench opening 132-2, but where each type of dual damascene process results in the semiconductor structure shown in FIG. 4. Moreover, interconnect layers of the BEOL structure can be formed using single damascene techniques. With a single damascene process, metal vias and metal lines are separately formed in different ILD layers. The damascene patterning can be implemented using any conventional photolithography and etching process, e.g., forming a photoresist mask and etching the dielectric material of the ILD layer using a dry etch process such as RIE (reactive ion etching), etc.

Figure 5:
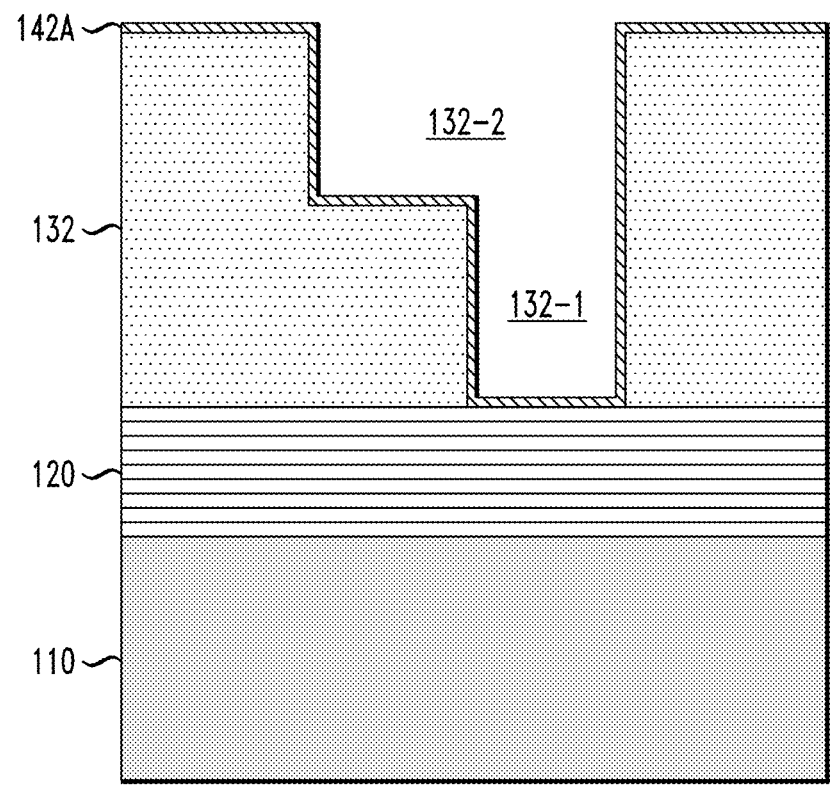

A next phase in the fabrication process comprises forming a metal interconnect structure in the first ILD layer 132, using a process flow as schematically illustrated in FIGS. 5 through 8. In particular, FIG. 5 is cross-sectional schematic side view of the semiconductor structure of FIG. 4 after depositing a layer of liner material 142A to line the sidewall and bottom surfaces of the opening 132-1/132-2 in the first ILD layer 132 with a thin liner. The liner material may include one or more thin layers of material such as, for example, tantalum (Ta), titanium (Ti), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB) which are suitable for the given application. As noted above, the thin liner layer serves as a barrier diffusion layer and adhesion layer. The layer of liner material 142A is deposited using known techniques such as CVD, ALD, PVD, etc.

Figure 6:
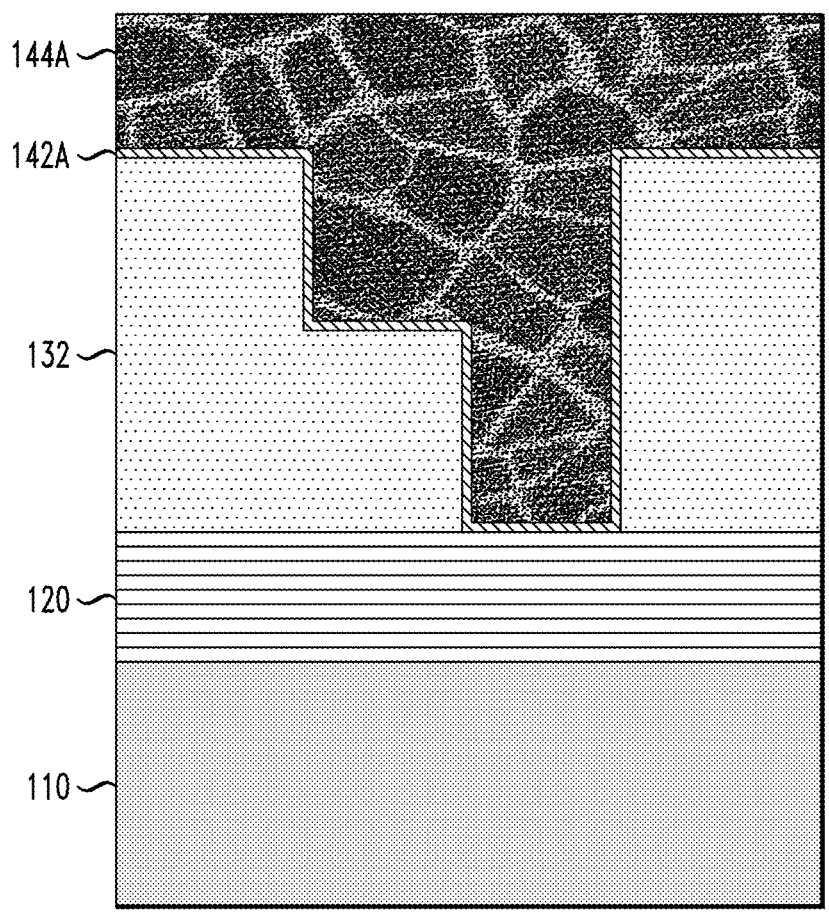

Next, FIG. 6 is cross-sectional schematic side view of the semiconductor structure of FIG. 5 after depositing a layer of metallic material 144A to fill the opening 132-1/132-2 in the first ILD layer 132 with metallic material. In one embodiment of the invention, the layer of metallic material 144A comprises copper (Cu). In other embodiments, the metallic material 144A can be, for example, aluminum (Al), tungsten (W), cobalt (Co), ruthenium (Ru), iridium (Ir), rhodium (Rh), nickel (Ni), or alloys thereof. The layer of metallic material 144A is deposited using known techniques such as electroplating, electroless plating, CVD, PVD, or a combination of methods. Prior to depositing the layer of conductive material 144A, a thin seed layer (e.g., Cu seed layer) may optionally be deposited (on the liner layer 142A) using a suitable deposition technique such as ALD, CVD or PVD. The seed layer can be formed of a material which enhances adhesion of the metallic material on the underlying material and which serves as catalytic material during a subsequent plating process. For example, a thin Cu seed layer can be deposited over the surface of liner layer 142A using PVD, followed by the electroplating of Cu to fill the dual damascene opening 132-1/132-2, resulting in the semiconductor structure of FIG. 6.

In an exemplary embodiment where the metallic material 144A comprises electroplated copper, the copper material 144A as deposited comprises a polycrystalline microstructure, as schematically illustrated in FIG. 6. A polycrystalline microstructure comprises many crystallites (or grains) of varying size and orientation, and with random texture and no grain direction. A polycrystalline microstructure comprises many grain boundaries, which tends to decrease the electrical conductivity of the metallic material, and tends to enhance electromigration due to grain boundary diffusion of electrons, which is not desirable. Accordingly, to further reduce the electrical resistance of the low aspect ratio metal wiring, the metallic material 144A is subjected to a heat treatment to convert the polycrystalline microstructure of the metallic material 144A into a different microstructure comprising larger grains with a given grain direction. For example, in one embodiment, the polycrystalline microstructure is converted into a "bamboo" or "columnar" microstructure, having large elongated grains that extend in a particular direction.

Figure 7:
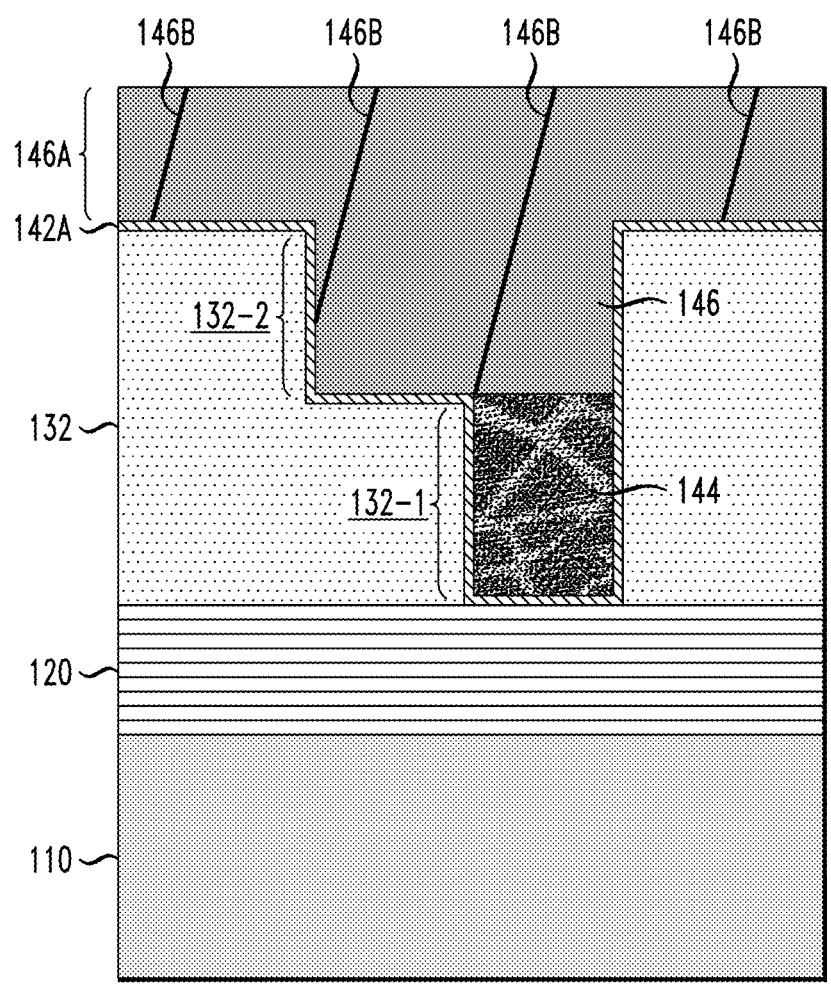

For example, FIG. 7 is cross-sectional schematic side view of the semiconductor structure of FIG. 6 after applying a heat treatment to the metallic material 144A to convert at least a portion of the metallic material 144A from a polycrystalline microstructure to a bamboo microstructure. In particular, in one example embodiment of the invention as shown in FIG. 7, the heat treatment is applied to convert the microstructure of the overburden metallic material 146A and the metallic material 146 which is disposed within the trench 132-2 from a polycrystalline microstructure (as shown in FIG. 6) to a bamboo microstructure as schematically shown in FIG. 7, while the microstructure of the metallic material 144 within the via opening 131-1 remains polycrystalline. As specifically shown in FIG. 7, the overburden metallic material 146A and the metallic material 146 within the trench 132-2 comprises large grains which are separated by grain boundaries 146B, providing a columnar or bamboo microstructure.

The heat treatment that is used to convert the polycrystalline microstructure of the metallic material 144A to a columnar or bamboo microstructure can be implemented using various techniques. For example, in one embodiment of the invention, the semiconductor structure of FIG. 6 can be placed in a furnace and subjected to a thermal anneal process in a temperature range of about 100 degrees Celsius to about 500 degrees Celsius for a period of about 20 minutes to about three hours. In another embodiment, a laser process can be implemented using known methods in which a laser beam (e.g., pulsed beam) is directed at the surface of the metallic material 144A to heat the metallic material 144A to a temperature which effectively causes a thermal anneal of the metallic material 144A and thus, a conversion of the polycrystalline microstructure to a columnar or bamboo microstructure. A laser process can heat the metallic material 144A to a relatively high temperature (e.g., in a range of 200~1000 degrees Celsius) in a short time frame (e.g., 10 nanoseconds to about 5 minutes). In this regard, the use of a laser process to heat treat the metallic material 144A provides precise temperature control of the metallic material 144A, while reducing potential thermal damage to surrounding features/components of the semiconductor structure when laser processing the metallic material 144A.

Figure 8:
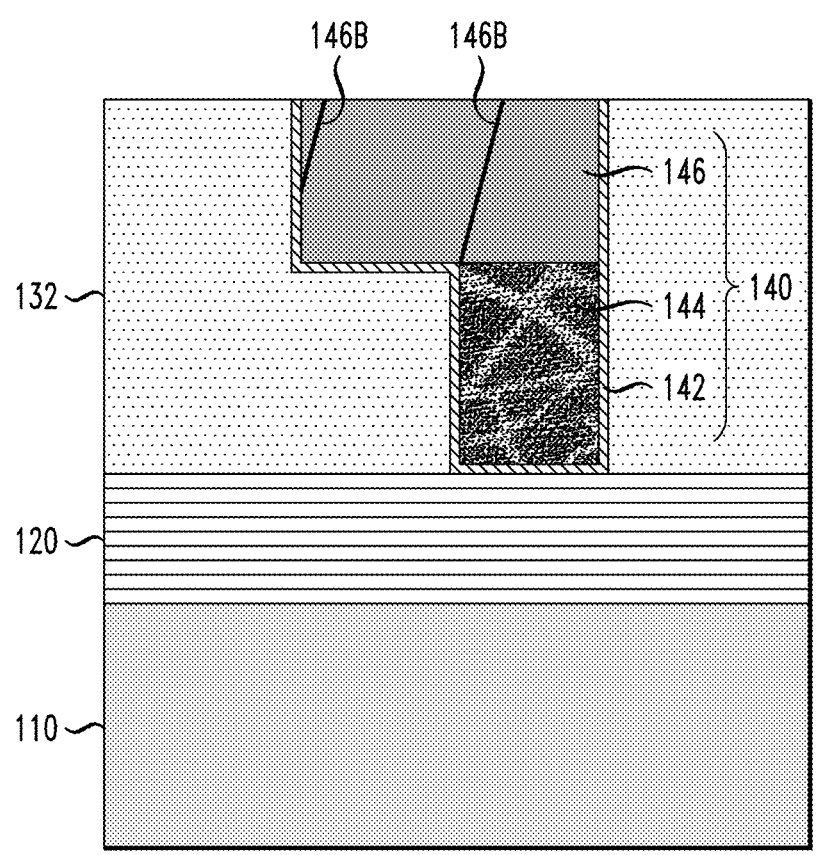

Following the heat treatment, the overburden metallic and liner material is removed by performing a chemical mechanical polishing process (CMP) to planarize the surface of the semiconductor structure down to the first ILD layer 132, resulting in the semiconductor structure shown in FIG. 8. In particular, FIG. 8 is cross-sectional schematic side view of the semiconductor structure of FIG. 7 after planarizing the surface of the semiconductor structure to form the first metal interconnect structure 140 in the first ILD layer 132. In the example embodiment of FIG. 8, the first metal line 146 comprises a columnar/bamboo microstructure with grain boundaries 146B that define relatively large crystallites (as compared to the critical dimensions of the first metal line 146), and the metal via 144 comprises a polycrystalline microstructure.

In one embodiment, an average grain size of the microstructure of the first metal line 146 is greater than a critical dimension (e.g., width W1) of the first metal line 146. Moreover, as shown in FIG. 8, the grain boundaries 146B of the first metal line 146 extend in substantially vertical directions such that the grain boundaries 146B end at the upper surface and/or the bottom of the first metal line 146. This microstructure serves to minimize electromigration as the grain boundaries extend in a substantially vertical direction which is essentially perpendicular to the current flow in the first metal line 146.

It is to be understood that the term "average grain size" as used herein is a well-known term of art, which denotes a parameter that can be estimated using known techniques. For example, one technique for estimating the average grain size of a given material is known as the "intercept" method. With this method, a straight line of a given length (L) is drawn through a micrograph of the crystal structure of the given material (e.g., a TEM (Transmission Electron Microscope) or STEM (Scanning Transmission Electron Microscope) microstructure image). The number of grains (N) that the straight line intersects is counted. The average grain size is then determined as (L)/(N).

Figure 9:
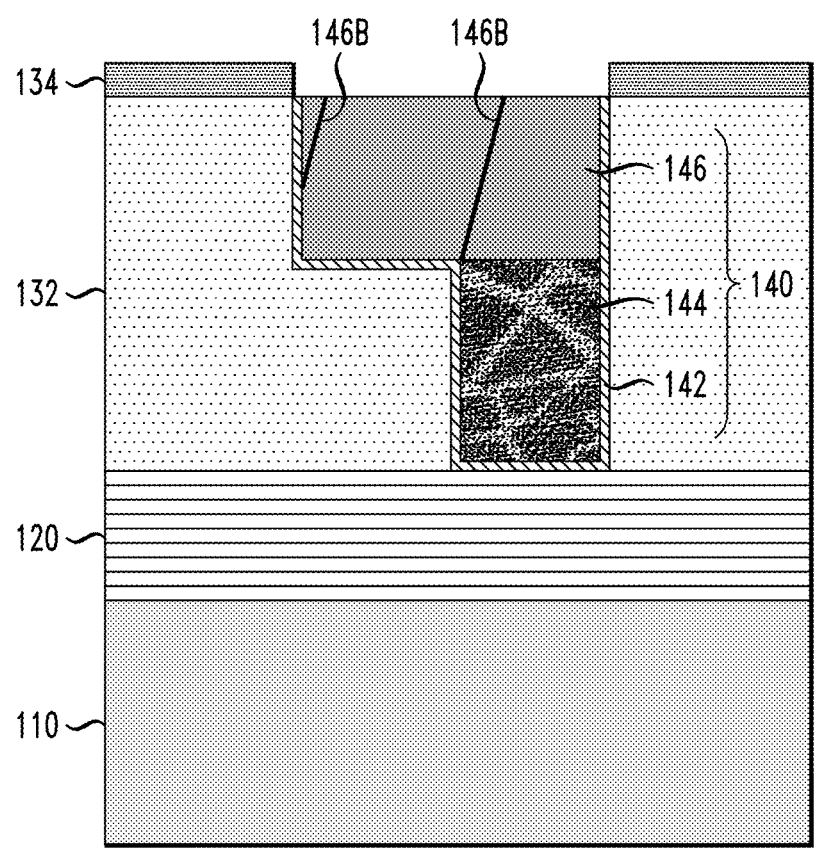

Next, FIG. 9 is cross-sectional schematic side view of the semiconductor structure of FIG. 8 after forming the etch stop layer 134 on the first ILD layer 132. In one embodiment, the etch stop layer 134 is formed by selectively depositing dielectric material using known techniques which cause the dielectric material to be deposited on the upper surface of first ILD layer 132 and not on the upper surface of the first metal line 146 of the metal interconnect structure 140. The etch stop layer 134 can be formed with any suitable dielectric material such as silicon oxide (e.g., SiO2), silicon nitride (e.g., Si3N4), silicon carbide (SiC), etc., which can be etched selective to the insulating materials that are used to form the first and second ILD layers 132 and 136. In one embodiment, the etch stop layer 134 is formed with a thickness in a range of about 1 nm to about 100 nm. As explained in further detail below, the etch stop layer 134 enables the formation of a self-aligned opening in an overlying insulating layer, which is deposited and patterned to form the next level of wiring.

Figure 10A:
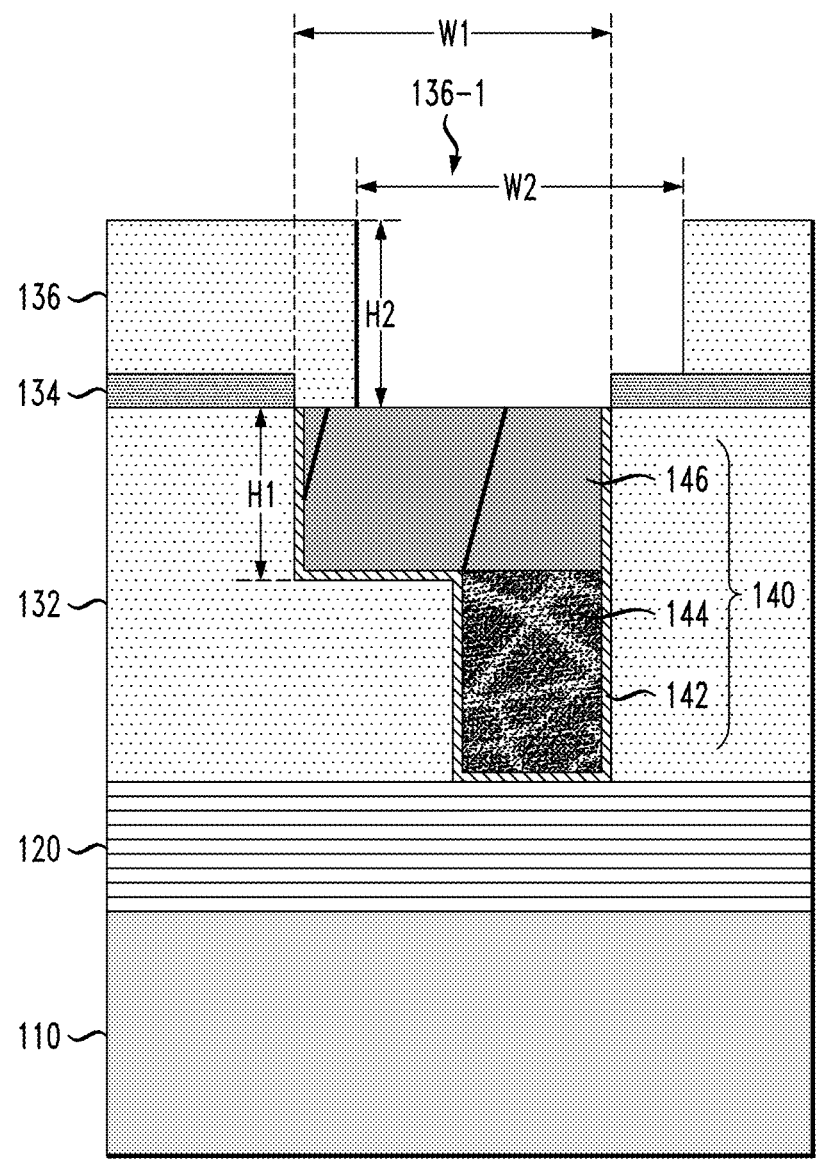
FIG. 10A is cross-sectional schematic side view of the semiconductor structure of FIG. 9 after depositing a second ILD layer and etching an opening in the second ILD layer to expose an upper surface of the first metal interconnect structure, wherein the opening is misaligned to the first metal interconnect structure.
Figure 10B:
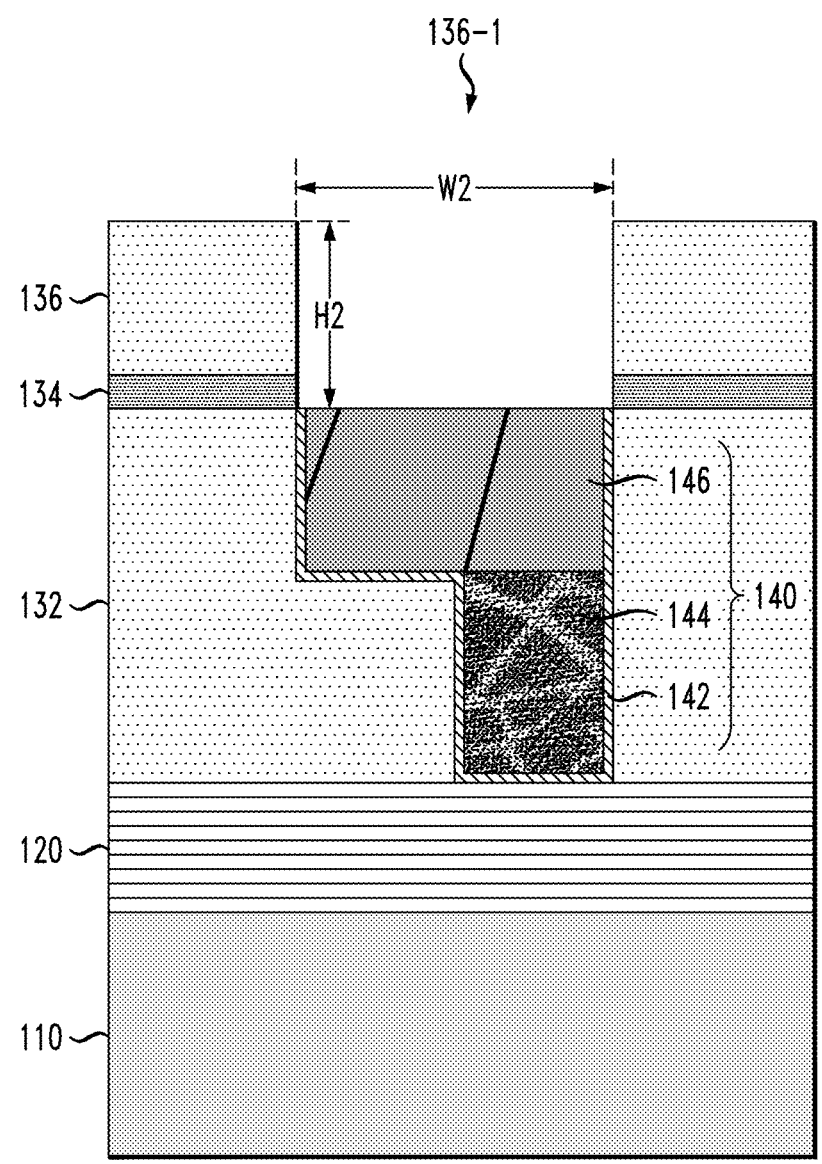
FIG. 10B is cross-sectional schematic side view of the semiconductor structure of FIG. 9 after depositing a second ILD layer and etching an opening in the second ILD layer to expose an upper surface of the first metal interconnect structure, wherein the opening is aligned to the first metal interconnect structure.

For example, FIG. 10A is cross-sectional schematic side view of the semiconductor structure of FIG. 9 after depositing and patterning a layer of insulating material to form the second ILD layer 136 with an opening 136-1 that exposes an upper surface of the underlying first metal interconnect structure 140. The second ILD layer 136 may comprise any suitable dielectric material such as silicon oxide (e.g. SiO2), silicon nitride (e.g., (Si3N4), SiCOH, SiCH, SiCNH, or other types of silicon-based low-k dielectrics or ULK dielectric materials. The second ILD layer 136 may be deposited using known deposition techniques, such as, for example, ALD, CVD, PVD, PECVD, or spin-on deposition. The thickness of the second ILD layer 136 will vary depending on the target aspect ratio H2/W2 of the opening 136-1. The opening 136-1 can be formed by photolithographically patterning the second ILD layer 136 using known techniques.

In one embodiment of the invention, as shown in FIG. 10A, the opening 136-1 comprises an aspect ratio H2/W2 which is less than 2.5. In one embodiment, the aspect ratio H2/W2 of the opening 136-1 is the same as the aspect ratio H1/W1 of the metal filled trench (e.g., first metal line 146), wherein the pattern of the opening 136-1 is formed to match the pattern of the first metal line 146 (e.g., W2=W1). In another embodiment, the opening 136-1 may have a pattern that is different from the pattern of the underlying first metal line 146 (e.g., W2>W1), but where the aspect ratio H2/W2 is still less than 2.5. The example embodiment of FIG. 10A illustrates an instance in which there is a misalignment between the etched opening 136-1 and the underlying first metal line 146. This is to be contrasted with the example embodiment of FIG. 10B which illustrates an instance where the etched opening 136-1 of the second ILD layer 136 is properly aligned with the underlying first metal line 146.

The selective deposition of the etch stop layer 134 serves to self-align the opening of the etch stop layer 134 to expose the entire surface of the first metal line 146, while ensuring that the surface of the underlying first ILD layer 132 is covered by the etch stop layer 134. Moreover, in embodiments where there is misalignment of the etched opening 136-1 and the underlying first metal line 146, or where the opening 136-1 is wider (W2>W1) than the first metal line 146, the etch stop layer 134 serves to prevent etching of the underlying first ILD layer 132 when patterning the second ILD layer 136 to form the opening 136-1, due to the etch selectivity between the materials of the etch stop layer 134 and the second ILD layer 136. For example, if the etch stop layer 134 is formed of silicon nitride and the second ILD layer 126 is formed of a silicon oxide, then the opening 136-1 can be formed by etching the second ILD layer 136 using an etch process and etch chemistry that etches the silicon oxide of the second ILD layer 136 selective to the silicon nitride of the underlying etch stop layer 134 (and metallic material of the first metal line 146).

As such, when there is a misalignment of the opening 136-1 (as shown in FIG. 10A), or when the opening 136-1 is wider than the underlying first metal line 146, the opening 136-1 can be etched through the second ILD layer 136 down to the surfaces of the first metal line 146 and the etch stop layer 134, while preventing etching of the underlying first ILD layer 132. In this manner, the selective deposition of the etch stop layer 134 enables the formation of the self-aligned opening 136-1 to the first metal line 146 without etching down into the underlying first ILD layer 132.

Figure 11:
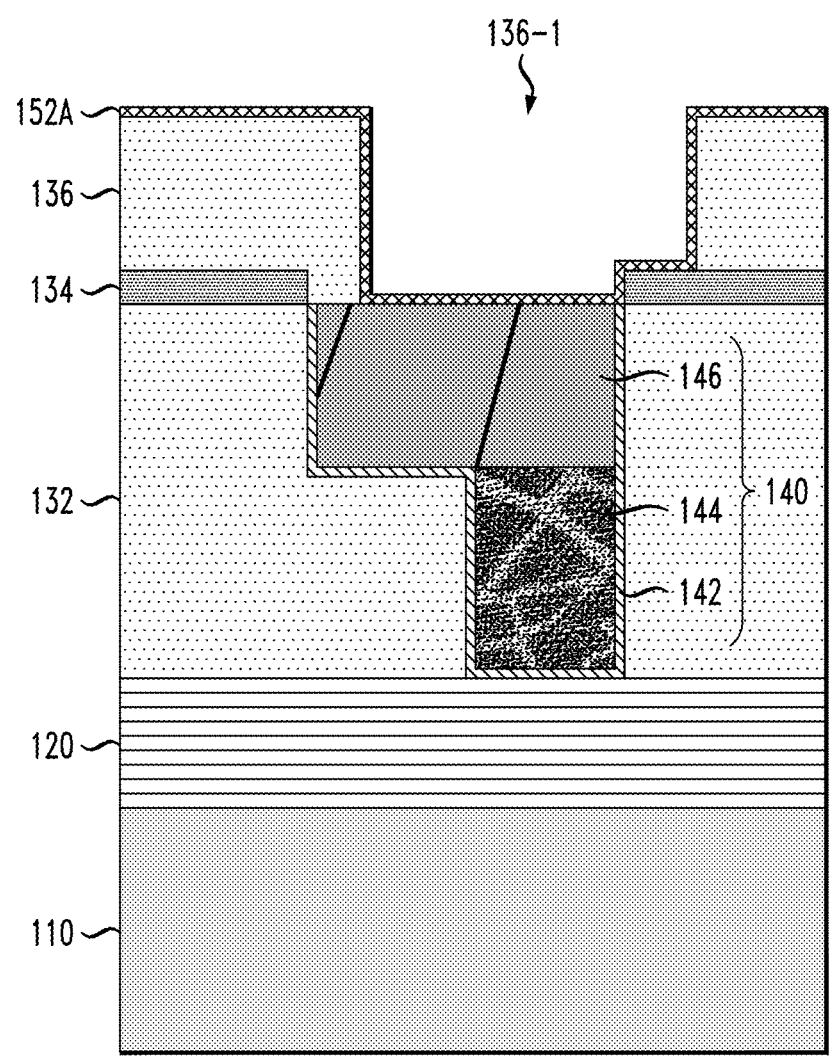
Figure 12:
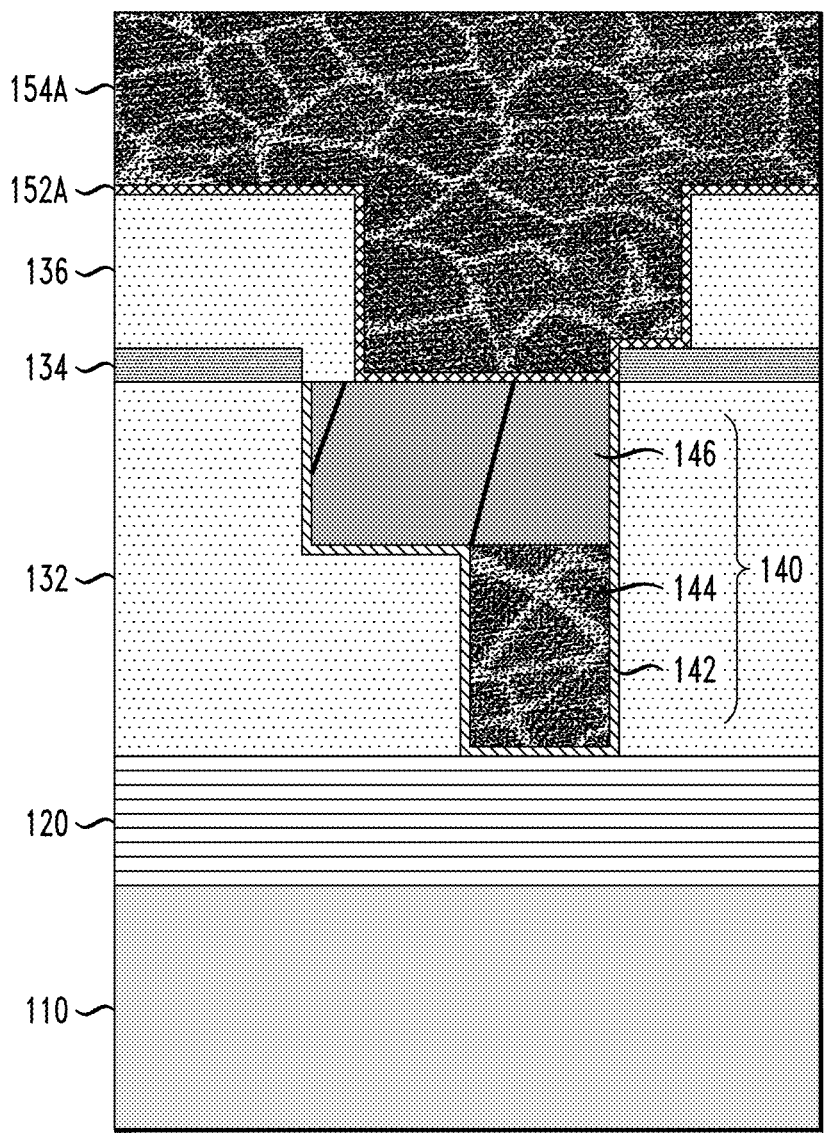
Figure 13:
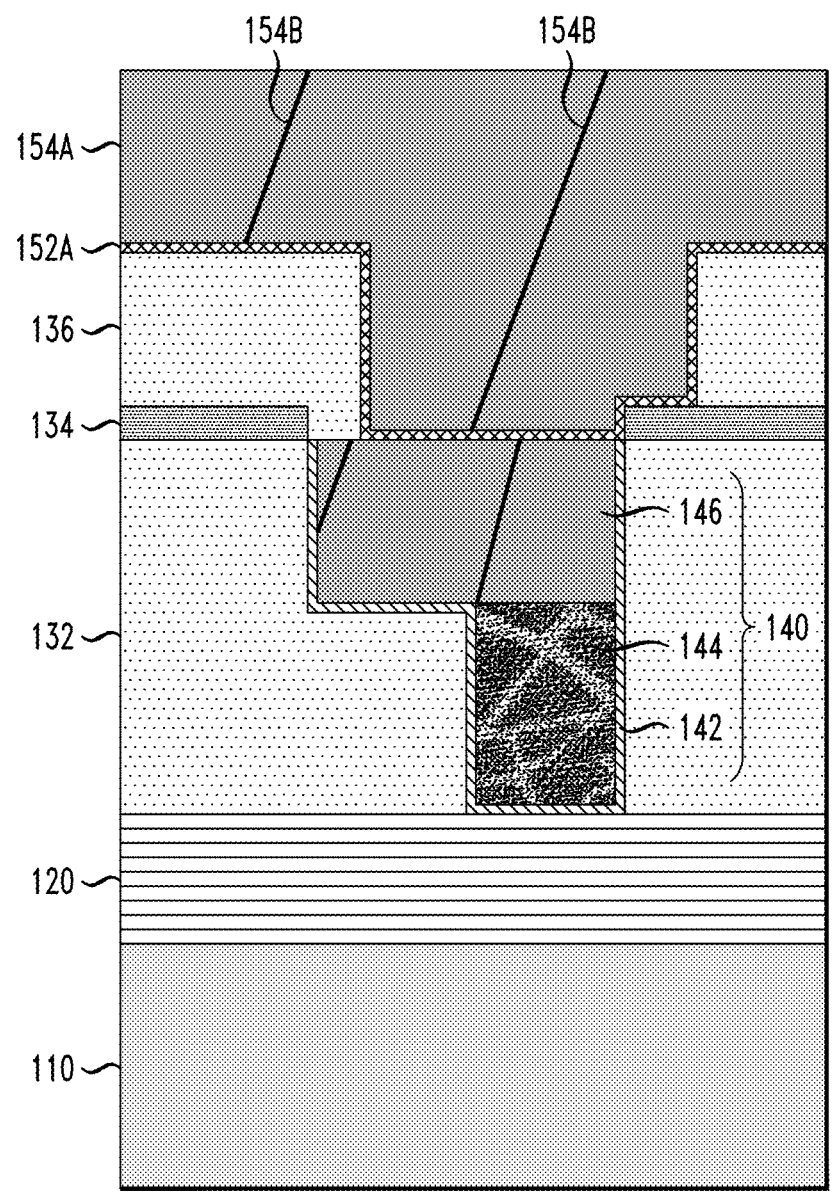

A next phase in the fabrication process comprises forming a metal interconnect structure in the second ILD layer 136, using a process flow as schematically illustrated in FIGS. 11, 12 and 13. In particular, FIG. 11 is cross-sectional schematic side view of the semiconductor structure of FIG. 10A after depositing a layer of liner material 152A to line the sidewall and bottom surfaces of the opening 136-1 in the second ILD layer 136 with a thin liner. The liner material may include one or more thin layers of material such as, for example, Ta, Ti, TaN, TiN, Co, Ru, W, WN, TiW, WN, Mn, MnN, or other liner materials (or combinations of liner materials) such as RuTaN, Ta/TaN, CoWP, NiMoP, NiMoB) which are suitable for the given application. As noted above, the thin liner layer serves as a barrier diffusion layer and adhesion layer. The layer of liner material 152A is deposited using known techniques such as CVD, ALD, PVD, etc.

Next, FIG. 12 is cross-sectional schematic side view of the semiconductor structure of FIG. 11 after depositing a layer of metallic material 154A to fill the opening 136-1 in the second ILD layer 136 with metallic material. In one embodiment of the invention, the layer of metallic material 154A comprises Cu. In other embodiments, the metallic material 154A comprises a metallic material such as, but not limited to, Al, W, Co, Ru, Ir, Rh, Ni, or alloys thereof. The layer of metallic material 154A is deposited using known techniques such as electroplating, electroless plating, CVD, PVD, or a combination of methods. Prior to depositing the layer of metallic material 154A, a thin seed layer (e.g., Cu seed layer) may optionally be deposited (on the liner layer 152A) using a suitable deposition technique such as ALD, CVD or PVD, to enhance adhesion of the metallic material 154A on the underlying liner material 152A and which serves as catalytic material during a subsequent plating process.

In an exemplary embodiment where the metallic material 154A comprises electroplated copper, the metallic material 154A as deposited comprises a polycrystalline microstructure, as schematically illustrated in FIG. 12. In one embodiment of the invention, to further reduce the electrical resistance of the low aspect ratio wiring, the metallic material 154A is subjected to a heat treatment to convert the polycrystalline microstructure of the metallic material 154A into a columnar or bamboo microstructure, having large elongated grains that extend in a particular direction.

For example, FIG. 13 is cross-sectional schematic side view of the semiconductor structure of FIG. 12 after applying a heat treatment to the metallic material 154A to convert the metallic material 154A from a polycrystalline microstructure to a bamboo microstructure. In particular, in one example embodiment of the invention as shown in FIG. 13, the heat treatment is applied to convert the microstructure of the overburden metallic material and the metallic material (e.g., the second metal line 154) which is disposed within the trench opening 136-1 from a polycrystalline microstructure (as shown in FIG. 12) to a bamboo microstructure as schematically shown in FIG. 13. As specifically shown in FIG. 13, the metallic material 154A comprises large grains which are separated by grain boundaries 154B, providing a columnar or bamboo microstructure. The heat treatment that is used to convert the polycrystalline microstructure of the metallic material 154A to a columnar or bamboo microstructure can be implemented using one of the exemplary heat treatment techniques (e.g., thermal anneal, laser processing, etc.) as discussed above.

Following the heat treatment, the overburden metallic and liner material as shown in FIG. 13 is removed by performing a CMP process to planarize the surface of the semiconductor structure down to the second ILD layer 136, thereby forming the second metal line 154, and resulting in the semiconductor structure shown in FIG. 1. In one embodiment, an average grain size of the microstructure of the second metal line 154 is greater than a critical dimension (e.g., width W2) of the second metal line 154. Moreover, as shown in FIGS. 1 and 13, the grain boundaries 154B of the second metal line 154 extend in substantially vertical directions such that the grain boundaries 154B end at the upper surface and/or the bottom of the second metal line 154.

It is to be understood that the process flow shown in FIG. 4 through FIG. 13 can be repeated to fabricate one or more additional wiring levels of the BEOL structure which comprises self-aligned, low resistance metal interconnect structures, according to embodiments of the invention. Moreover, in other embodiments of the invention, the process flow of FIGS. 4 through 13 can be slightly modified to fabricate the semiconductor devices 200 and 300 shown in FIGS. 2 and 3.

Figure 14:
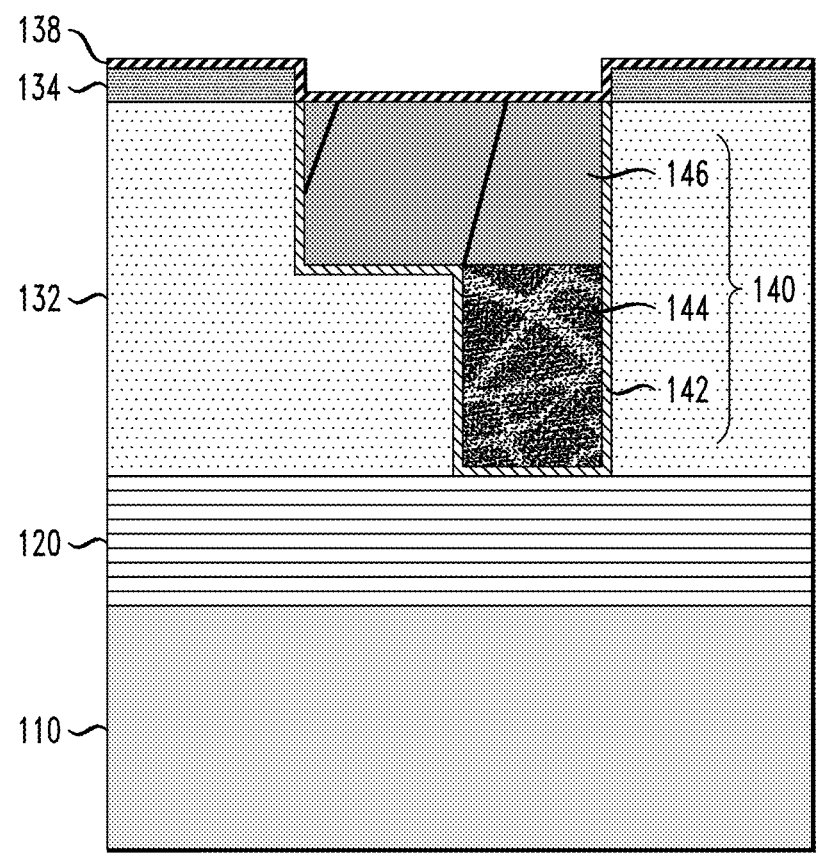
FIG. 14 is a cross-sectional schematic side view of the semiconductor structure of FIG. 9 after forming a dielectric capping layer by depositing a conformal layer of dielectric material over the etch stop layer and the exposed upper surface of the first metal interconnect structure, as part of a process flow according to another embodiment of the invention to fabricate the semiconductor device of FIG. 2.

For example, FIG. 14 is a cross-sectional schematic side view of the semiconductor structure of FIG. 9 after depositing a conformal layer of dielectric material 138 over the etch stop layer 134 and the exposed upper surface of the first metal interconnect structure 140, as part of a process flow according to another embodiment of the invention to fabricate the semiconductor device of FIG. 2. The conformal layer of dielectric material 138 is formed of a dielectric material that is non-reactive with the metallic material of the first metal line 146 (e.g., prevent diffusion of the metallic material of the first metal line 146 into the second ILD layer 136, prevent oxidation of the metallic material of the first metal line 146, etc.). For example, the conformal layer of dielectric material 138 may comprise SiC when the etch stop layer 134 is formed of silicon oxide or silicon nitride. When the etch stop layer 134 is formed of silicon oxide, the conformal layer of dielectric material 138 can be formed of silicon nitride or silicon carbide.

Following the deposition of the conformal layer of dielectric material 138, the process flow continues (e.g., FIG. 10A) by depositing and patterning the second ILD layer 136 to form the opening 136-1 which is subsequently filled with metallic material to form the second interconnect structure 150. The portion of the conformal layer of dielectric material 138 that is exposed through the opening 136-1 is etched away prior to the deposition of the layer of liner material 152A (FIG. 11). The remaining portion of the conformal layer of dielectric material 138 serves as the dielectric capping layer 138 as shown in FIG. 2.

Figure 15:
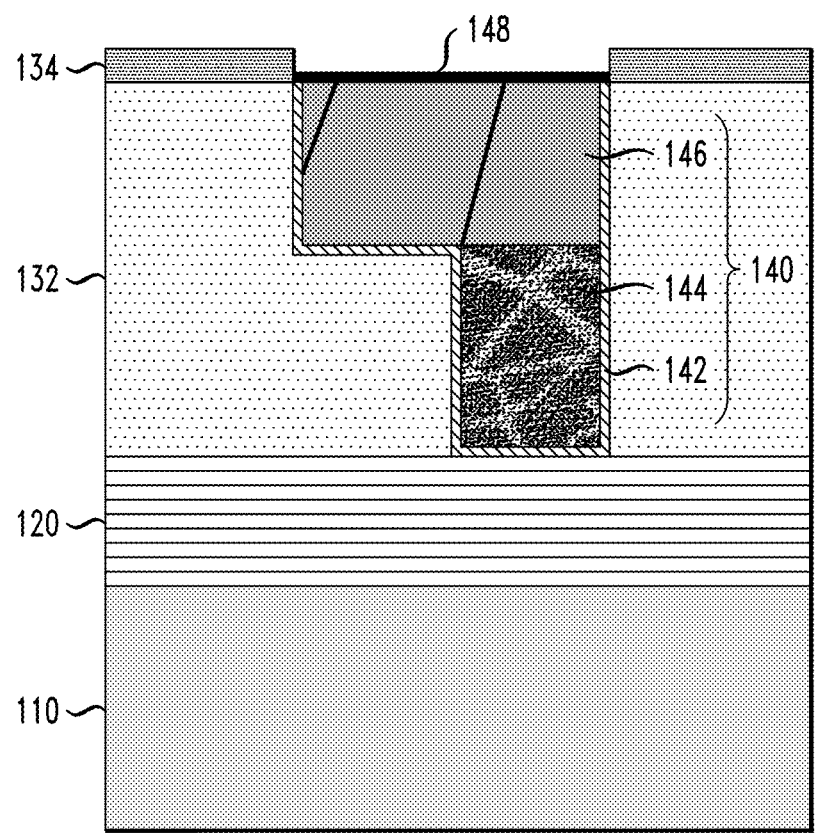
FIG. 15 is a cross-sectional schematic side view of the semiconductor structure of FIG. 9 after selectively forming a metal capping layer on the exposed upper surface of the first metal interconnect structure, as part of a process flow according to another embodiment of the invention to fabricate the semiconductor device of FIG. 3.

Next, FIG. 15 is a cross-sectional schematic side view of the semiconductor structure of FIG. 9 after selectively forming a metallic capping layer 148 on the exposed upper surface of the first metal interconnect structure 140, as part of a process flow according to another embodiment of the invention to fabricate the semiconductor device of FIG. 3. In one embodiment of the invention, the metallic capping layer 148 is formed by selectively depositing a layer of metallic material such that the metallic material is deposited on the upper surface of the first metal line 146 and not on the upper surface of the etch stop layer 134. The metallic capping layer 148 can be formed with any suitable metallic material including, but not limited to, Co, Mn, Al, Ru, Ti, and Ni. The metallic capping layer 148 can be deposited on the first metal line 146 selective to the etch stop layer 134 using known deposition techniques such as ALD, CVD, or electroless deposition.

Following the selective deposition of the metallic capping layer 148, the process flow continues (e.g., FIG. 10A) by depositing and patterning the second ILD layer 136 to form the opening 136-1 which is subsequently filled with metallic material to form the second interconnect structure 150. The portion of the metallic capping layer 148 that is exposed through the opening 136-1 is etched away prior to the deposition of the layer of liner material 152A (FIG. 11). The remaining portion of the metallic capping layer 148 on the surface of the first metal line 146 (see FIG. 3) serves as a protective layer to prevent diffusion of the metallic material of the first metal line 146 into the second ILD layer 136, and prevent oxidation of the metallic material of the first metal line 146, etc.

It is to be understood that the methods discussed herein for fabricating low resistance BEOL interconnect structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

I claim:

1. A method for fabricating a semiconductor device, comprising:
    forming a first insulating layer on a substrate;
    forming a first metal line in the first insulating layer, wherein the first metal line comprises a first aspect ratio which is less than 2.5;
    forming an etch stop layer on a surface of the first insulating layer, wherein forming the etch stop layer comprises selectively depositing a layer of dielectric material on the surface of the first insulating layer selective to the first metal line so that the layer of dielectric material is not deposited on the surface of the first metal line;
    depositing a second insulating layer over the etch stop layer and the first metal line;
    etching the second insulating layer to form an opening in the second insulating layer down to the first metal line, wherein the second insulating layer is etched selective to the etch stop layer to prevent etching of the first insulating layer; and
    filling the opening with a metallic material to form a second metal line in contact with the first metal line, wherein the second metal line comprises a second aspect ratio which is less than 2.5;
    wherein the first and second metal lines collectively form a single metal line of one metallization level of an interconnect structure.

2. The method of claim 1, wherein filling the opening with a metallic material comprises:
    depositing a layer of metallic material over the second insulating layer to fill the opening in the second insulating layer with the metallic material;
    performing a heat treatment to convert a microstructure of the deposited metallic material from a first microstructure to a second microstructure; and
    removing overburden metallic material from the surface of the second insulating layer.

3. The method of claim 2, wherein the first microstructure comprises a polycrystalline microstructure and wherein the second microstructure comprises a bamboo microstructure.

4. The method of claim 3, wherein grain boundaries of the second microstructure end at one of the upper surface of the second metal line and a bottom of the second metal line.

5. The method of claim 2, wherein an average grain size of the second microstructure of the second metal line is greater than a critical dimension of the second metal line.

6. The method of claim 2, wherein performing a heat treatment comprises thermally annealing the layer of metallic material in a furnace at a target temperature.

7. The method of claim 2, wherein performing a heat treatment comprises applying laser radiation to the layer of metallic material to heat the metallic material to a target temperature.

8. The method of claim 1, wherein the first metal line and the second metal line comprise a same pattern.

9. The method of claim 1, wherein the first metal line and the second metal line collectively form a single copper damascene interconnect structure.

10. The method of claim 1, further comprising;
    forming a dielectric capping layer by depositing a conformal layer of dielectric material on the etch stop layer and the surface of the first metal line prior to depositing the second insulating layer; and
    etching a portion of the dielectric capping layer that is exposed through the opening that is etched in the second insulating layer.

11. A method for fabricating a semiconductor device, comprising:
    forming a first insulating layer on a substrate;
    forming a first metal line in the first insulating layer, wherein the first metal line comprises a first aspect ratio which is less than 2.5;
    forming an etch stop layer on a surface of the first insulating layer, wherein forming the etch stop layer comprises selectively depositing a layer of dielectric material on the surface of the first insulating layer selective to the first metal line;
    depositing a second insulating layer over the etch stop layer and the first metal line;
    etching the second insulating layer to form an opening in the second insulating layer down to the first metal line, wherein the second insulating layer is etched selective to the etch stop layer to prevent etching of the first insulating layer; and
    filling the opening with a metallic material to form a second metal line in contact with the first metal line, wherein the second metal line comprises a second aspect ratio which is less than 2.5;
    wherein the method further comprises:
    forming a metal capping layer on the surface of the first metal line prior to depositing the second insulating layer, wherein forming the metal capping layer comprises selectively depositing a layer of metallic material on the surface of the first metal line selective to the etch stop layer; and
    etching a portion of the metal capping layer that is exposed through the opening that is etched in the second insulating layer.

12. The method of claim 1, wherein the first and second metal lines and the first and second insulating layers collectively form a single interconnect level of a BEOL (back end of line) structure of the semiconductor device.

13. The method of claim 1, wherein a resistivity of the first metal line and the second metal line is less than about 7 µΩ-cm.

14. The method of claim 11, wherein filling the opening with a metallic material comprises:
   depositing a layer of metallic material over the second insulating layer to fill the opening in the second insulating layer with the metallic material;
   performing a heat treatment to convert a microstructure of the deposited metallic material from a first microstructure to a second microstructure; and
   removing overburden metallic material from the surface of the second insulating layer.

15. The method of claim 14, wherein the first microstructure comprises a polycrystalline microstructure and wherein the second microstructure comprises a bamboo microstructure.

16. The method of claim 14, wherein performing a heat treatment comprises thermally annealing the layer of metallic material in a furnace at a target temperature.

17. The method of claim 14, wherein performing a heat treatment comprises applying laser radiation to the layer of metallic material to heat the metallic material to a target temperature.

18. The method of claim 11, wherein the first metal line and the second metal line comprise a same pattern.

19. The method of claim 11, wherein, the first and second metal lines and the first and second insulating layers collectively form a single interconnect level of a BEOL (back end of line) structure of the semiconductor device.

20. The method of claim 11, wherein a resistivity of the first metal line and the second metal line is less than about 7 µΩ-cm.

* * * * *